United States Patent
Newton et al.

(10) Patent No.: US 9,794,994 B2
(45) Date of Patent: Oct. 17, 2017

(54) METHODS AND APPARATUS FOR TOUCH-SENSITIVE LIGHTING CONTROL

(71) Applicant: PHILIPS LIGHTING HOLDING B.V., Eindhoven (NL)

(72) Inventors: Philip Steven Newton, Waalre (NL); Tatiana Aleksandrovna Lashina, Eindhoven (NL); Tim Dekker, Eindhoven (NL); Bartel Marinus Van De Sluis, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 0 days.

(21) Appl. No.: 15/028,218

(22) PCT Filed: Sep. 26, 2014

(86) PCT No.: PCT/IB2014/064847
§ 371 (c)(1),
(2) Date: Apr. 8, 2016

(87) PCT Pub. No.: WO2015/052612
PCT Pub. Date: Apr. 16, 2015

(65) Prior Publication Data
US 2016/0242251 A1 Aug. 18, 2016

Related U.S. Application Data

(60) Provisional application No. 61/888,158, filed on Oct. 8, 2013.

(51) Int. Cl.
*H05B 37/02* (2006.01)
*H05B 33/08* (2006.01)
(Continued)

(52) U.S. Cl.
CPC ....... *H05B 33/0845* (2013.01); *F21V 23/005* (2013.01); *F21V 23/0485* (2013.01);
(Continued)

(58) Field of Classification Search
CPC .... G06F 3/044; G06F 3/0416; G06F 3/04847; G06F 2203/04104; G06F 3/0421;
(Continued)

(56) References Cited

U.S. PATENT DOCUMENTS 6,016,038 A 1/2000 Mueller et al.
6,211,626 B1 4/2001 Lys et al.
(Continued)

FOREIGN PATENT DOCUMENTS

CH 705688 A1 4/2013
CN 202484681 U 10/2012
(Continued)

*Primary Examiner* — Douglas W Owens
*Assistant Examiner* — Amy Yang
(74) *Attorney, Agent, or Firm* — Meenakshy Chakravorty

(57) ABSTRACT

Disclosed is a lighting assembly (10) that includes a mounting surface (14) that that allows the installer to attach the assembly to an external structure (15) with an adhesive strip (144). The lighting assembly also includes a light-emitting surface (18) that directs spot illumination to a predetermined display area (17) by way of a combination of collimated light-emitting elements (182) and an optical element (184). The lighting assembly also features a touch-sensitive surface (16) that allows the user to both program the lighting assembly and control the display lighting in a flexible manner by providing the user with different modes of interacting with the lighting assembly.

20 Claims, 8 Drawing Sheets

(51) Int. Cl.
*F21V 23/04* (2006.01)
*H03K 17/96* (2006.01)
*F21V 29/70* (2015.01)
*F21V 23/00* (2015.01)
*G06F 3/041* (2006.01)
*G06F 3/042* (2006.01)
*G06F 3/044* (2006.01)
*G06F 3/0484* (2013.01)
*G06F 3/0488* (2013.01)
*F21W 131/301* (2006.01)
*F21W 131/405* (2006.01)

(52) U.S. Cl.
CPC ............ *F21V 29/70* (2015.01); *G06F 3/044* (2013.01); *G06F 3/0416* (2013.01); *G06F 3/0421* (2013.01); *G06F 3/04847* (2013.01); *G06F 3/04883* (2013.01); *H03K 17/96* (2013.01); *H05B 33/0863* (2013.01); *H05B 37/0227* (2013.01); *F21W 2131/301* (2013.01); *F21W 2131/405* (2013.01); *G06F 2203/04104* (2013.01); *H03K 2217/96066* (2013.01)

(58) Field of Classification Search
CPC ............ G06F 3/04883; H05B 37/0227; H05B 33/0845; F21V 29/70; F21V 23/005; F21V 23/0485; F21W 2131/301; F21W 2131/405; H03K 17/96
USPC ................................ 315/297, 291, 307, 308
See application file for complete search history.

(56) References Cited

U.S. PATENT DOCUMENTS

| | | | | |
|---|---|---|---|---|
| 6,462,669 | B1 * | 10/2002 | Pederson | B60Q 1/2611 315/200 A |
| 6,467,928 | B2 * | 10/2002 | Crelin | F21S 8/033 362/147 |
| 7,014,336 | B1 | 3/2006 | Ducharme et al. | |
| 7,453,217 | B2 | 11/2008 | Lys et al. | |
| 2010/0301773 | A1 | 12/2010 | Chemel et al. | |
| 2010/0327766 | A1 * | 12/2010 | Recker | H02J 9/02 315/291 |
| 2011/0181207 | A1 * | 7/2011 | Ross | H05B 37/029 315/362 |
| 2012/0105367 | A1 * | 5/2012 | Son | G06F 3/0414 345/174 |

FOREIGN PATENT DOCUMENTS

WO 03059016 A1 7/2003
WO 2011007325 A1 1/2011

* cited by examiner

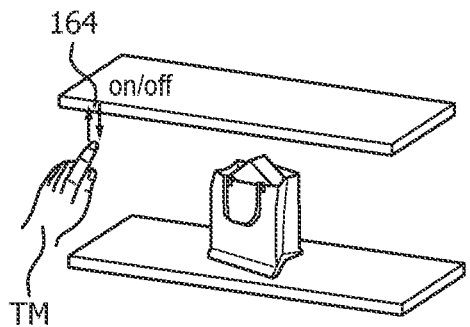
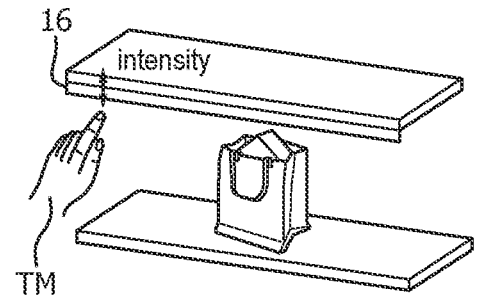
FIG. 6A    FIG. 6B
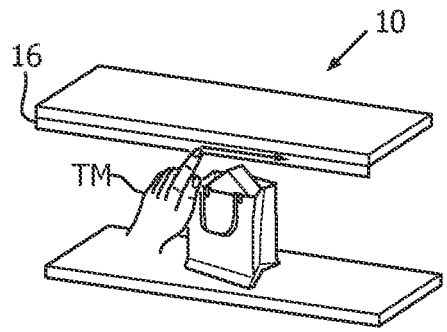
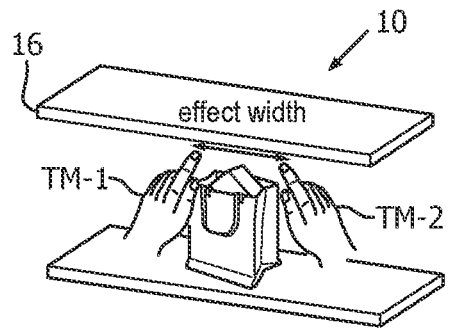
FIG. 6C    FIG. 6D
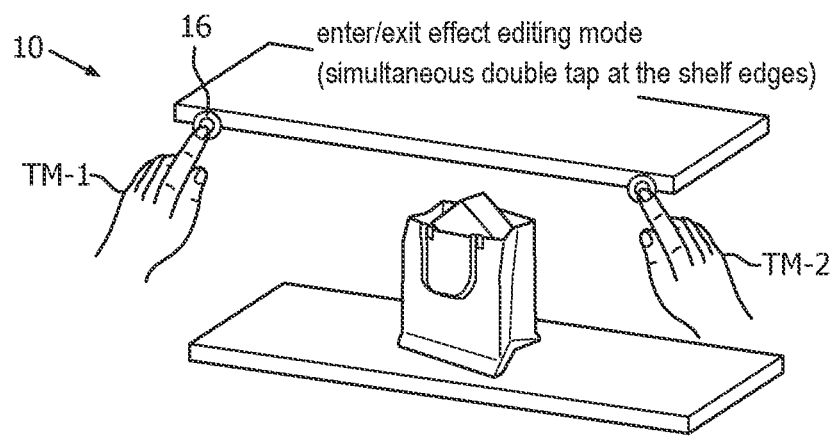
FIG. 6E

METHODS AND APPARATUS FOR TOUCH-SENSITIVE LIGHTING CONTROL

CROSS-REFERENCE TO PRIOR APPLICATIONS

This application is the U.S. National Phase application under 35 U.S.C. §371 of International Application No. PCT/IB2014/064847, filed on Sep. 26, 2014, which claims the benefit of U.S. Provisional Patent Application No. 61/888,158, filed on Oct. 8, 2013. These applications are hereby incorporated by reference herein.

TECHNICAL FIELD

The present invention is directed generally to lighting control. More particularly, the various inventive solutions disclosed herein relate to controlling display lighting for commercial or retail applications.

BACKGROUND

In many commercial or retail environments, spotlighting is used to illuminate products on display. Traditionally, light sources suitable for this purpose are disposed in the ceiling or built into display cases or product shelving. For example, a lighting strip having ON/OFF functionality can be disposed in a product display case to provide a uniform illumination of constant intensity over a retailer's wares. Over time, products may be cycled in and out of a display case or a shelf, but the lighting scheme remains unchanged.

Today's competitive realities are causing retailers to consider various ways of enhancing product appeal. At the same time, modern production processes, as well as product innovations, rapidly create new and updated products. These product updates and new releases lead to a high rate of inventory turnover because new products are being constantly delivered to stores. The retailer is motivated to display these products soon after they arrive into the store inventory. As a result, a portion of the shop, and on some occasions the entire shop, must be redesigned and restocked in a very short time frame.

Accordingly, in view of the challenging competitive climate that currently exists in the retail environment, traditional lighting display approaches have their drawbacks. Retailers would welcome inexpensive, flexible and easy to use display lighting solutions. An interactive shelf luminaire that is easily adjusted to provide customized lighting effects could help alleviate some of the challenges faced by today's retailers.

Digital lighting technologies, i.e. illumination based on semiconductor light sources, such as light-emitting diodes (LEDs), offer a viable alternative to traditional fluorescent, HID, and incandescent lamps. Functional advantages and benefits of LEDs include high energy conversion and optical efficiency, durability, lower operating costs, and many others. Recent advances in LED technology have provided efficient and robust full-spectrum lighting sources that enable a variety of lighting effects in many applications.

In many cases, retail spotlighting fixtures previously located on the ceiling are being moved to the display shelf. One advantage to this approach is that products can be individually illuminated from a short distance. In order to implement this approach, it has been proposed to mount LED-based linear shelf lighting strips in the display case over the product, or integrated in the product shelf itself. In one approach that has been considered, a luminaire with a touch-sensitive control is used to provide a lighting strip that has dimming functionality. One drawback with this approach is that the same dimming level is applied to all of the LEDs in the strip. In another approach that has been considered, a shelf area luminaire with a gesture sensing mechanism can be employed to provide a single interaction point for determining which LEDs in the luminaire are to be activated. Similarly, a desk lamp may be equipped with a touch-sensitive surface that is configured to activate selected LEDs in a linear LED array.

One drawback to conventional approaches is generating uniform lighting over the target area. However, in retail applications, a uniform light distribution along a display shelf can be perceived by consumers as being dull and uninteresting. This is especially true for displays that display luxury and fashion items. There are often empty spaces between items on a display shelf, and it makes little sense to illuminate these empty spaces along with the items on-sale. For the best effect, high intensity light should be directed onto the products, and no light, or low-intensity light should be directed onto the empty spaces between the products.

Thus, there is a need in the art for an inexpensive, easy-to-install, and easy-to-use display lighting solution that allows the user to tailor the lighting distribution to any given product display. Stated differently, a display lighting system is desired that allows the user to direct the spot lighting effect to any location or region on the shelf, and to adjust the amount of contrast and variation in the lighting distribution as desired.

SUMMARY

The present disclosure is directed to inventive methods and apparatuses for lighting control. For example, the various inventive solutions disclosed herein are directed to an inexpensive, easy-to-install, and easy-to-use lighting assembly that enables the user to tailor the lighting distribution to virtually any display configuration. The lighting assembly features a mounting surface that that allows the installer to attach the assembly to an external structure with an adhesive strip. The lighting assembly also includes a light emitting surface that directs spot illumination to any desired location by way of a combination of collimated LEDs and an optical element, such as a lens. The lighting assembly also features a touch-sensitive surface that allows the user to both program the assembly and readily control the display lighting in a flexible manner by providing the user with different modes of interacting with the assembly. For example, using a single touch command, the user may touch the touch-sensitive surface with a finger or a stylus to control light intensity, establish the location of the light beam and the beam width. Alternatively, the user can perform these same control actions with two fingers (e.g., one on each hand) to actuate the touch-sensitive surface at two spaced apart locations. Moreover, the user can alternate between a one finger touch command and a two-finger touch command at will; the control circuit of the present invention correctly interprets these actions, such that the user is provided with a flexible and easy-to-use luminaire.

Generally, in one aspect, the present invention is directed to a lighting assembly having a body member coupled to an optical element. The body member is configured to be coupled to an external structure. The optical element is configured to direct a light beam toward a predetermined display area. A lighting unit is disposed in the body member, and includes an array of light-emitting elements. One or more of the array of light-emitting elements is configured to emit the light beam toward the optical element. A touch-sensitive surface is coupled to the body member, the touch-sensitive surface including a touch sensor configured to provide at least one lighting control signal in response to a lighting display touch command. The lighting display touch command is effected by either a one-location touch command action or a two-location touch command action. A control circuit is disposed in the body member, the control circuit being coupled to the lighting unit and the touch-sensitive surface. The control circuit is configured to interpret the at least one lighting control signal generated by the one-location touch command action or the two-location touch command action as one of a plurality of lighting display actions in accordance with the lighting display touch command. The plurality of lighting display actions include emitting the light beam from selected light-emitting elements of the array of light emitting elements to establish a location of the light beam and a size of the light beam in at least one spatial dimension, and controlling an intensity of the light emitted from the selected light-emitting elements.

The body member may include a heat sink layer configured to direct thermal energy generated by the assembly into the external structure.

In some embodiments, the touch-sensitive surface includes at least one mode control interface configured to provide electrical mode control signals in response to mode control touch commands. The control circuit is configured to drive the lighting display assembly in a predetermined operational mode in accordance with the electrical mode control signals.

In some embodiments, the one-location touch command action is performed by touching the touch-sensitive surface with a tactual member at a first touch spot location and slidably moving the tactual member from the first touch spot location to a second touch spot location.

In some embodiments, the two-location touch command action includes touching the touch-sensitive surface with a first tactual member at a first touch spot and substantially simultaneously touching the touch-sensitive surface with a second tactual member at a second touch spot spaced apart from the first touch spot.

In some versions of embodiments, a two-location touch command action to decrease the size of the emitted light beam or decrease the intensity of the emitted light beam is performed by decreasing a distance between the first touch spot and the second touch spot by slidably moving either or both of the first tactual member and the second tactual member along the touch-sensitive surface.

In some versions of embodiments, a two-location touch command action to increase the size of the emitted light beam or increase the intensity of the emitted light beam is performed by increasing a distance between the first single touch spot and the second single touch spot by sliding either or both of the first tactual member and the second tactual member along the touch-sensitive surface.

In some embodiments, the lighting display control interface includes a two-dimensional matrix of touch sensors. In some versions of embodiments, each touch sensor in the two-dimensional matrix substantially corresponds to one of the light-emitting elements in the array of light-emitting elements. Also, in some versions of embodiments, each touch sensor is a capacitive touch sensor. In some versions of embodiments, each touch sensor is an optical touch sensor.

In some versions of embodiments, lighting assembly includes a communication interface coupled to the control circuit and configured to transmit data to an external device or receive data from the external device. The communications interface can be selected from a group of communications interfaces that includes a serial data bus, a wireless communications interface and an optical communications interface. In some versions of embodiments, the external device is a second lighting assembly.

In some versions of embodiments, the body member has a substantially triangular cross-section including the optical element on a first side, touch-sensitive surface on a second side, and a mounting surface on a third side.

In some embodiments, the mounting surface comprises an adhesive element configured to mount the body member to the external structure. In some versions of embodiments, the adhesive element is configured to conduct thermal energy from the body member to the external structure.

Generally, in another aspect, the invention relates to a method that includes the steps of: providing a lighting unit including an array of light emitting elements and touch-sensitive surface including a touch sensor; receiving a lighting display touch command from the touch sensor, the lighting display touch command being effected by either a one-location touch command action or a two-location touch command action; generating at least one lighting control signal in response to performing the lighting display touch command; interpreting the at least one lighting control signal provided by the one-location touch command action or the two-location touch command action as one of a plurality of lighting display actions in accordance with the lighting display touch command, the plurality of lighting display actions including emitting the light beam from selected light-emitting elements of the array of light emitting elements to establish a location of the light beam and a size of the light beam in at least one spatial dimension, and controlling an intensity of the light emitted from the selected light-emitting elements; and emitting the light beam from the selected light-emitting elements to perform the lighting display action in accordance with the lighting display touch command.

In some versions of embodiments, the method also includes the steps of: receiving a mode control touch command from a mode control interface; and generating a electrical mode control signal in response to receiving the mode control touch command such that the array of light-emitting elements is operated in a predetermined operational mode.

In some versions of embodiments, the the one-location touch command action is performed by touching the lighting display control interface at a first touch spot location with a tactual member and slidably moving the tactual member from the first touch spot location to a second touch spot location.

In some versions of embodiments, the two-location touch command action includes touching the touch-sensitive surface with a first tactual member at a first touch spot and substantially simultaneously touching the lighting display control interface with a second tactual member at a second touch spot spaced apart from the first touch spot.

In some versions of embodiments, the two-location touch command action to decrease the size of the emitted light beam or decrease the intensity of the emitted light beam is performed by decreasing a distance between the first touch spot and the second touch spot by slidably moving either or both of the first tactual member and the second tactual member along the touch-sensitive surface.

In some versions of embodiments, the two-location touch command action to increase the size of the emitted light beam or increase the intensity of the emitted light beam is performed by increasing a distance between the first single touch spot and the second single touch spot by sliding either or both of the first tactual member and the second tactual member along the touch-sensitive surface.

In some versions of embodiments, the method further comprises the step of transmitting data to an external device or receiving data from the external device, the data including lighting display action data or operational mode data.

As used herein for purposes of the present disclosure, the term "LED" should be understood to include any electroluminescent diode or other type of carrier injection/junction-based system that is capable of generating radiation in response to an electric signal. Thus, the term LED includes, but is not limited to, various semiconductor-based structures that emit light in response to current, light emitting polymers, organic light emitting diodes (OLEDs), electroluminescent strips, and the like. In particular, the term LED refers to light emitting diodes of all types (including semi-conductor and organic light emitting diodes) that may be configured to generate radiation in one or more of the infrared spectrum, ultraviolet spectrum, and various portions of the visible spectrum (generally including radiation wavelengths from approximately 400 nanometers to approximately 700 nanometers). Some examples of LEDs include, but are not limited to, various types of infrared LEDs, ultraviolet LEDs, red LEDs, blue LEDs, green LEDs, yellow LEDs, amber LEDs, orange LEDs, and white LEDs (discussed further below). It also should be appreciated that LEDs may be configured and/or controlled to generate radiation having various bandwidths (e.g., full widths at half maximum, or FWHM) for a given spectrum (e.g., narrow bandwidth, broad bandwidth), and a variety of dominant wavelengths within a given general color categorization.

For example, one implementation of an LED configured to generate essentially white light (e.g., a white LED) may include a number of dies which respectively emit different spectra of electroluminescence that, in combination, mix to form essentially white light. In another implementation, a white light LED may be associated with a phosphor material that converts electroluminescence having a first spectrum to a different second spectrum. In one example of this implementation, electroluminescence having a relatively short wavelength and narrow bandwidth spectrum "pumps" the phosphor material, which in turn radiates longer wavelength radiation having a somewhat broader spectrum.

It should also be understood that the term LED does not limit the physical and/or electrical package type of an LED. For example, as discussed above, an LED may refer to a single light emitting device having multiple dies that are configured to respectively emit different spectra of radiation (e.g., that may or may not be individually controllable). Also, an LED may be associated with a phosphor that is considered as an integral part of the LED (e.g., some types of white LEDs). In general, the term LED may refer to packaged LEDs, non-packaged LEDs, surface mount LEDs, chip-on-board LEDs, T-package mount LEDs, radial package LEDs, power package LEDs, LEDs including some type of encasement and/or optical element (e.g., a diffusing lens), etc.

The terms "light-emitting element" and "light source" are used interchangeably herein and should be understood to refer to any one or more of a variety of radiation sources, including, but not limited to, LED-based sources (including one or more LEDs as defined above), incandescent sources (e.g., filament lamps, halogen lamps), fluorescent sources, phosphorescent sources, high-intensity discharge sources (e.g., sodium vapor, mercury vapor, and metal halide lamps), lasers, other types of electroluminescent sources, radioluminescent sources, and luminescent polymers.

A given light source may be configured to generate electromagnetic radiation within the visible spectrum, outside the visible spectrum, or a combination of both. Hence, the terms "light" and "radiation" are used interchangeably herein. Additionally, a light source may include as an integral component one or more filters (e.g., color filters), lenses, or other optical components. Also, it should be understood that light sources may be configured for a variety of applications, including, but not limited to, indication, display, and/or illumination. An "illumination source" is a light source that is particularly configured to generate radiation having a sufficient intensity to effectively illuminate an interior or exterior space. In this context, "sufficient intensity" refers to sufficient radiant power in the visible spectrum generated in the space or environment (the unit "lumens" often is employed to represent the total light output from a light source in all directions, in terms of radiant power or "luminous flux") to provide ambient illumination (i.e., light that may be perceived indirectly and that may be, for example, reflected off of one or more of a variety of intervening surfaces before being perceived in whole or in part).

The term "spectrum" should be understood to refer to any one or more frequencies (or wavelengths) of radiation produced by one or more light sources. Accordingly, the term "spectrum" refers to frequencies (or wavelengths) not only in the visible range, but also frequencies (or wavelengths) in the infrared, ultraviolet, and other areas of the overall electromagnetic spectrum. Also, a given spectrum may have a relatively narrow bandwidth (e.g., a FWHM having essentially few frequency or wavelength components) or a relatively wide bandwidth (several frequency or wavelength components having various relative strengths). It should also be appreciated that a given spectrum may be the result of a mixing of two or more other spectra (e.g., mixing radiation respectively emitted from multiple light sources).

For purposes of this disclosure, the term "color" is used interchangeably with the term "spectrum." However, the term "color" generally is used to refer primarily to a property of radiation that is perceivable by an observer (although this usage is not intended to limit the scope of this term). Accordingly, the terms "different colors" implicitly refer to multiple spectra having different wavelength components and/or bandwidths. It also should be appreciated that the term "color" may be used in connection with both white and non-white light.

The term "color temperature" generally is used herein in connection with white light, although this usage is not intended to limit the scope of this term. Color temperature essentially refers to a particular color content or shade (e.g., reddish, bluish) of white light. The color temperature of a given radiation sample conventionally is characterized according to the temperature in degrees Kelvin (K) of a black body radiator that radiates essentially the same spectrum as the radiation sample in question. Black body radiator color temperatures generally fall within a range of from approximately 700 degrees K (typically considered the first visible to the human eye) to over 10,000 degrees K; white light generally is perceived at color temperatures above 1500-2000 degrees K.

Lower color temperatures generally indicate white light having a more significant red component or a "warmer feel," while higher color temperatures generally indicate white light having a more significant blue component or a "cooler feel." By way of example, fire has a color temperature of approximately 1,800 degrees K, a conventional incandescent bulb has a color temperature of approximately 2848 degrees K, early morning daylight has a color temperature of approximately 3,000 degrees K, and overcast midday skies have a color temperature of approximately 10,000 degrees K. A color image viewed under white light having a color temperature of approximately 3,000 degree K has a relatively reddish tone, whereas the same color image viewed under white light having a color temperature of approximately 10,000 degrees K has a relatively bluish tone.

The term "lighting fixture" is used herein to refer to an implementation or arrangement of one or more lighting units in a particular form factor, assembly, or package. The term "lighting unit" is used herein to refer to an apparatus including one or more light sources of same or different types. A given lighting unit may have any one of a variety of mounting arrangements for the light source(s), enclosure/housing arrangements and shapes, and/or electrical and mechanical connection configurations. Additionally, a given lighting unit optionally may be associated with (e.g., include, be coupled to and/or packaged together with) various other components (e.g., control circuitry) relating to the operation of the light source(s). An "LED-based lighting unit" refers to a lighting unit that includes one or more LED-based light sources as discussed above, alone or in combination with other non LED-based light sources. A "multi-channel" lighting unit refers to an LED-based or non LED-based lighting unit that includes at least two light sources configured to respectively generate different spectrums of radiation, wherein each different source spectrum may be referred to as a "channel" of the multi-channel lighting unit.

The term "controller" is used herein generally to describe various apparatus relating to the operation of one or more light sources. A controller can be implemented in numerous ways (e.g., such as with dedicated hardware) to perform various functions discussed herein. A "processor" is one example of a controller which employs one or more microprocessors that may be programmed using software (e.g., microcode) to perform various functions discussed herein. A controller may be implemented with or without employing a processor, and also may be implemented as a combination of dedicated hardware to perform some functions and a processor (e.g., one or more programmed microprocessors and associated circuitry) to perform other functions. Examples of controller components that may be employed in various embodiments of the present disclosure include, but are not limited to, conventional microprocessors, application specific integrated circuits (ASICs), and field-programmable gate arrays (FPGAs).

In various implementations, a processor or controller may be associated with one or more storage media (generically referred to herein as "memory," e.g., volatile and non-volatile computer memory such as RAM, PROM, EPROM, and EEPROM, floppy disks, compact disks, optical disks, magnetic tape, etc.). In some implementations, the storage media may be encoded with one or more programs that, when executed on one or more processors and/or controllers, perform at least some of the functions discussed herein. Various storage media may be fixed within a processor or controller or may be transportable, such that the one or more programs stored thereon can be loaded into a processor or controller so as to implement various aspects of the present invention discussed herein. The terms "program" or "computer program" are used herein in a generic sense to refer to any type of computer code (e.g., software or microcode) that can be employed to program one or more processors or controllers.

The term "user interface" as used herein refers to an interface between a human user or operator and one or more devices that enables communication between the user and the device(s). Examples of user interfaces that may be employed in various implementations of the present disclosure include, but are not limited to, switches, potentiometers, buttons, dials, sliders, a mouse, keyboard, keypad, various types of game controllers (e.g., joysticks), track balls, display screens, various types of graphical user interfaces (GUIs), touch screens, microphones and other types of sensors that may receive some form of human-generated stimulus and generate a signal in response thereto.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

FIGS. 6A-6E include diagrams illustrating user actuation of a touch-sensitive surface in accordance with embodiments of the invention;

DETAILED DESCRIPTION

Applicants have recognized and appreciated that it would be beneficial to provide the retail industry with an inexpensive, easy-to-install, and easy-to-use lighting solution for display shelves that allows the user to easily tailor the lighting distribution and intensity to virtually any desired display configuration.

In view of the foregoing, various embodiments and implementations of the present invention are directed to a lighting assembly that includes a mounting surface that allows the installer to attach the assembly to an external structure with an adhesive strip. The lighting assembly also includes a light emitting surface that directs spot illumination to any desired location by way of a combination of collimated light-emitting elements and an optical element such as a lens. The lighting assembly also features an easy-to-use touch-sensitive surface that allows the user to both program the lighting assembly and control the display lighting in a flexible manner by providing the user with different modes of interacting with the assembly.

Figure 1:
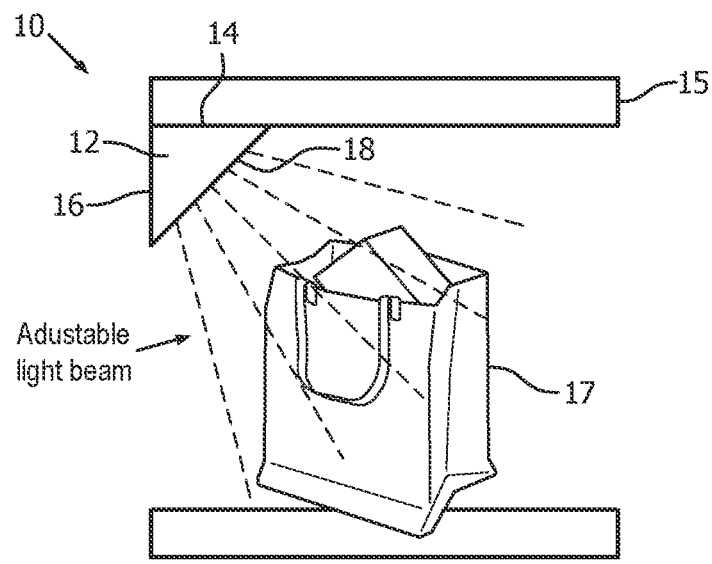
FIG. 1 is a diagram of a lighting assembly in accordance with one embodiment of the present invention.

As embodied herein and depicted in FIG. 1, a diagram of a touch-sensitive strip lighting assembly 10 employing one or more LEDs as light-emitting elements in accordance with one embodiment of the present invention is disclosed. The lighting assembly 10 includes a body member 12 that features three functional surfaces: a mounting surface 14, a touch-sensitive surface 16, and a light-emitting surface 18. The mounting surface 14 is configured to mount the body member 12 to an external structure 15, which can be a display shelf, a rack, a cabinet, or a variety of other structures. In particular, the mounting surface may include an adhesive element (element 144 shown in FIG. 3) that makes the lighting assembly 10 relatively easy to mount to the external surface. Moreover, the mounting surface 14 may also provide the assembly with heat dissipation functionality.

The touch-sensitive surface 16 provides a touch input for controlling lighting effects. The light-emitting surface 18 directs spot light illumination to a predetermined display area 17 of a display or shelf. The directional spot illumination may be achieved by a combination of light-emitting elements 182, e.g. collimated LEDs, and an optical element (e.g., a lens) configured to direct the emitted light in a desired direction. In another embodiment of the invention, the light-emitting elements are LEDs are equipped with collimators and disposed on a rotational member that provides the user with another way to control the directivity of the emitted light. Both these methods are described in more detail herein, but it will be appreciated that other optical means to direct the collimated light down are also within scope of this invention.

Figure 2:
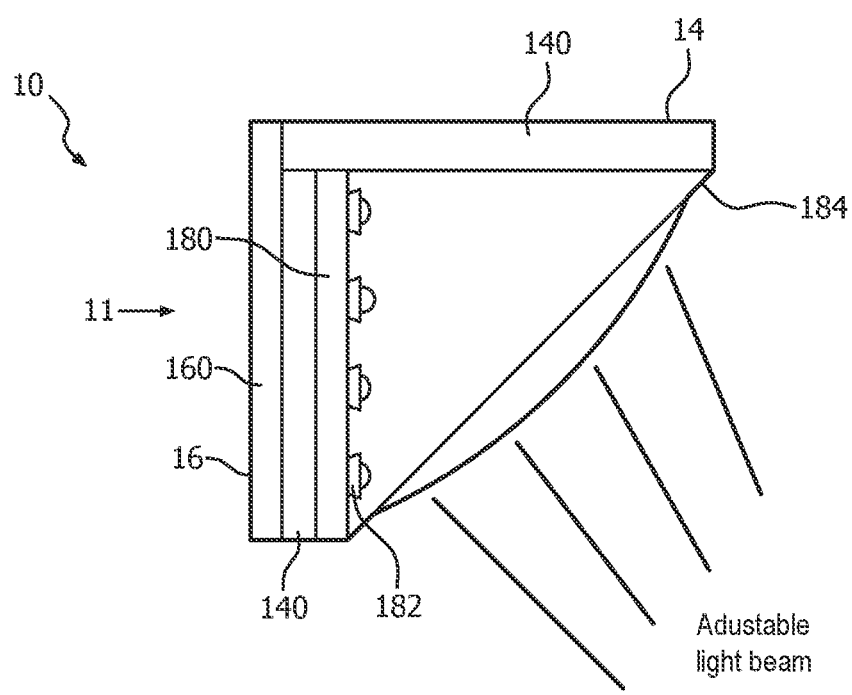
FIG. 2 is a cross-sectional diagram of the lighting assembly depicted in FIG. 1.

Referring to FIG. 2, a cross-sectional diagram of the lighting assembly 10 depicted in FIG. 1 is disclosed. In one embodiment, the touch-sensitive surface 16 is disposed on a lighting unit 11 including a multi-layer structure that includes a control electronics printed circuit board (PCB) 160, a heat sink layer 140, and an LED PCB 180. The control electronics PCB may include, inter alia, the touch sensor circuitry, low power drive circuitry and the control circuit. The heat sink layer 140 includes a portion that is incorporated into the mounting surface 14 and extends at a right angle to the lighting unit 11 such that the thermal energy generated by the LED PCB 180 is directed into the external structure and dissipated. The LED drive circuits and the light-emitting elements 182 are disposed on the LED PCB 180. The light emitted by the light-emitting elements 182 is directed toward the predetermined display area 17 by the optical element 184. Because the LED PCB includes high power drive circuitry, the AC/DC conversion circuitry (e.g., diode bridge, etc.) may also be disposed on the LED PCB.

In various embodiments, the lighting unit 11 including one or more LEDs capable of producing different colors, e.g. red, green, and blue, or white light with different color temperatures, as well as a processor for independently controlling the output of the LEDs in order to generate a variety of colors, color temperatures and color-changing lighting effects, enabling the user to control color and/or color temperature of the combined light output over the target area(s), for example, as discussed in detail in U.S. Pat. Nos. 6,016,038, 6,211,626, 7,014,336, and 7,453,217, incorporated herein by reference.

Figure 3:
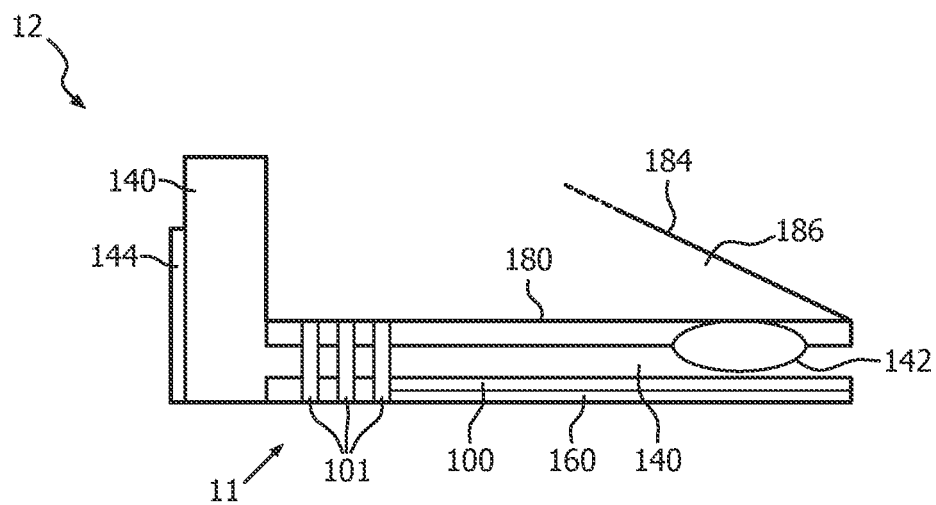
FIG. 3 is a diagram illustrating layers of the lighting assembly depicted in FIG. 2.

Referring to FIG. 3, a detailed diagram illustrating the various layers of the lighting unit 11 depicted in FIG. 2 is disclosed. Again, the multi-layer PCB structure of the lighting unit includes three major layers. The LED PCB 180 is the layer that generates light and most of the heat. The light-emitting elements 182 (not shown in this view) are mounted on the side of the LED PCB 180 facing the optical element 184. The LED driver electronics 106 (not shown in FIG. 3) may include the high power drivers used to energize the light-emitting elements 182. Those skilled in the art will appreciate that the driver circuits may include transistor devices and other elements (e.g., MOSFETs, diacs, triacs, etc.) that are used to switch the AC power signal ON and OFF during the AC cycle to effect pulse width modulation (PWM). The PWM duty cycle is varied in response to control inputs to regulate the intensity of the light being emitted by the light-emitting elements 182, for example, as discussed in U.S. Pat. Nos. 6,016,038 and 6,211,626 mentioned above.

Those skilled in the art will appreciate that the body member 12 may be coupled to AC power using any suitable means. For example, the body member 12 may be equipped with hot, neutral and ground terminals that provide an installer with connection points for a hot conductor, neutral conductor and ground conductor, respectively. Alternatively, the lighting assembly 10 may be equipped with an AC power plug that is configured to be inserted into an AC socket. In yet another alternative embodiment, the lighting assembly 10 may be equipped with AC power leads that may be coupled to the AC power conductors with twist-on connector elements (e.g., wire-nuts). Moreover, the hot and neutral conductors of the AC power source may be connected to one or more circuits in the drive electronics to provide PWM power to the LEDs. In addition, AC power is typically coupled to a diode bridge or some other voltage regulator arrangement to convert the AC power signals into rectified DC power signals suitable for use by the control electronics PCB 160.

The heat sink layer 140 in the lighting unit 11 may be fabricated using any suitable heat conducting material (e.g., copper) that serves to direct the heat generated by the LED's and high power electronics into the external structure for dissipation. The LED PCB 180 may be coupled to the heat sink layer 140 by a heat conducting paste 142. The heat conducting paste may be silicone-oil based with various ceramic additives. The heat sink layer 140 can also be connected to an electrical ground and thus also serves as an electronic shielding structure that prevents interference of the LED PCB 180 from affecting the performance of the control electronics PCB 160. In one embodiment of the invention, portions of the metal surface of the heat sink layer 140 may be exposed within the light emitting chamber 186 and be polished to function as a light reflector to improve LED efficiency. The heat transfer surfaces of the heat sink layer 140 provide a relatively rough surface to optimize heat transfer.

The touch-sensitive surface 16 is disposed on the control electronics PCB 160 and includes one or more touch sensors 162 disposed on one surface of the control electronics PCB. In one embodiment of the present invention, a control circuit 100 is disposed on the opposite side of the control electronics PCB 160 as shown in FIG. 3. Vias 101 may be disposed in the multi-layer structure of the lighting unit 11 to distribute power signals, control signals, and ground to the various circuit elements.

Referring back to the light-emitting surface 18, the optical element 184 may be configured to redirect the emitted light towards the predetermined display area 17 being illuminated. This optical element 184 may be connected to the LED PCB 180 by a snap-in mechanical mounting arrangement or it may be attached to the LED PCB 180 via adhesive element 144.

Figure 4:
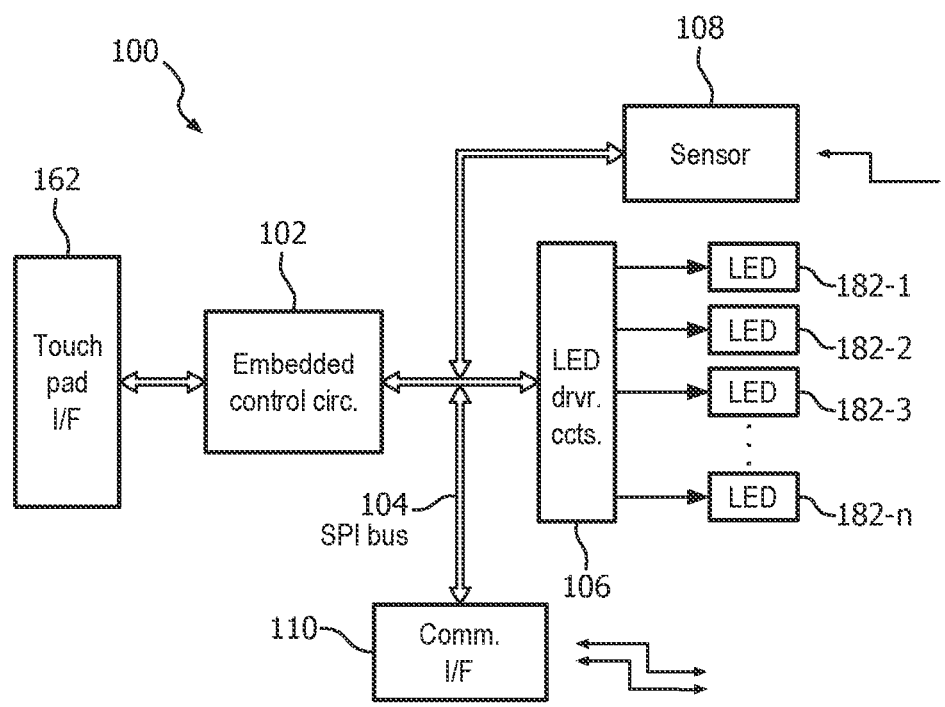
FIG. 4 is a schematic diagram illustrating control circuitry in accordance with an embodiment of the invention.

Referring to FIG. 4, a schematic diagram illustrating control circuit 100 in accordance with one embodiment of the invention is disclosed. The control circuit 100 includes a controller 102 that is coupled to a touch sensor 162, such as a capacitive touch sensor. The controller 102 is configured to interpret the touch sensor inputs (provided by the user) and drive the LED driver circuits 106 such that selected light-emitting elements in the array (182-1 . . . 182-*n*) emit light with a selected beam width and intensity. In one embodiment of the present invention, another sensor 108 may be coupled to the control circuit 100. Sensor 108 is configured to detect the presence of a display object within the predetermined display area 17. The controller 102 is configured to derive the spatial coordinates of these objects from the sensor data and determine which light-emitting elements in the array (182-1 . . . 182-*n*) to actuate. The sensor 108 may be implemented as an optical sensor or as a secondary touch or pressure sensor disposed on the display shelf and configured to sense the weight or mass of the object. In this embodiment, the user may employ the touch sensor 162 to fine tune the light emissions resulting from sensor 108.

According to an embodiment, the control circuit (100) is located within the body member and is coupled to the lighting unit and the touch-sensitive surface. The control circuit receives a lighting control signal generated by the touch sensor in response to sensor inputs from the user, also known as a lighting display command action. The control circuit then interprets the lighting display command action as one of a number of possible lighting display actions, which can include emitting the light beam from selected light-emitting elements of the array of light-emitting elements to establish a location of the light beam and a size of the light beam in at least one spatial dimension, and controlling an intensity of the light beam emitted from the selected light-emitting elements, among many other possibilities.

It will be apparent to those of ordinary skill in the pertinent art that modifications and variations can be made to controller 102 of the present invention depending on a variety of factors. In one embodiment, the controller 102 may be implemented by an 8-bit reduced instruction set computer (RISC) device such as the Atmega 1280, or by a device that is at least an equivalent. The RISC device may include, e.g., 128 KB ISP flash memory, 8 KB SRAM, 4 KB EEPROM, 86 general purpose I/O lines, 32 general purpose working registers, a real time counter, PWM, 4 USARTs, a serial interface, 16-channel 10-bit A/D converter, and other features. Of course, the present invention should not be construed as being limited to this arrangement. The controller 102 may be implemented using any suitable processor or microcontroller device, application specific integrated circuits (ASICs), field programmable gate array devices (FPGAs), analog circuitry or a combination of all of the above.

In one embodiment of the present invention, the touch sensor 162 is implemented by an array of capacitive elements, each of which is connected to an input of the controller 100. In one embodiment, the capacitive element includes an appropriately valued resistor element (e.g., 10 MΩ) coupled between the controller input and a sensor pad. A filter circuit may also be coupled to the resistor to provide noise filtering. In one embodiment, the noise filter is implemented using a capacitive filter circuit. When a user's finger or stylus (i.e., a tactual element) approaches the sensor element, the capacitance of the sensor element is changed. Stated differently, the controller senses the charge at that location and interprets it as a "touch spot." As described below, the controller monitors the movements of the touch spot (or touch spots) and interprets them as control inputs or commands. In another embodiment, the touch sensor 162 may be implemented optically. In response to the lighting display touch command from the user, the touch sensor generates a lighting control signal that can be sent to another component in the lighting assembly, such as the control circuit 100.

In one embodiment of the present invention, the LED driver circuits 106 may be implemented by many commercially-available LED drivers, such as the TLC5940. This device driver is controllable over a serial peripheral interface bus 104 and provides 16 individually adjustable constant-current sink channels having 4096 levels of PWM brightness control. Those skilled in the art will appreciate that any suitable driver circuit may be employed depending on the display application and the complexity of the circuit and/or application.

The communication interface 110 of control circuit 100 may include any suitable interface including wireless interfaces, wireline interfaces, optical communications interfaces, RFID, NFC interfaces and the like. For example, the communication interface can be configured to transmit and/or receive data to and from an external device. In one embodiment of the invention, the communication interface 110 may include a serial data bus device that includes a USB port. The USB port allows the control circuit 100 to be coupled to other touch-sensitive LED assemblies to form a larger system that can be controlled through any one of the touch-sensitive inputs. In other words, touch spots or touch points may be shared between assemblies such that each controller can determine which LEDs to activate.

For example, the lighting assembly 10 may include an electrical port on one of its sides to allow it to be connected to an adjacent assembly. In this configuration, the controller 102 senses the interconnection and is configured to enter a mode of operation whereby one of the units functions as a master and the other unit(s) as slave(s). The touch input from one strip may be read from an adjacent strip by the master using, for example, an I2C bus. The master then determines which LEDs should be activated and sends the appropriate commands to the slaves over the communication bus. The number of slaves may be restricted by the speed of the bus; if the system includes too many slave units, the user interaction may appear to be sluggish. To overcome this, the touchpads may be continuously scanned by the slaves with the result being made available to the master. This ensures that the bus is not a limit on the speed of detecting touch input.

Figure 5:
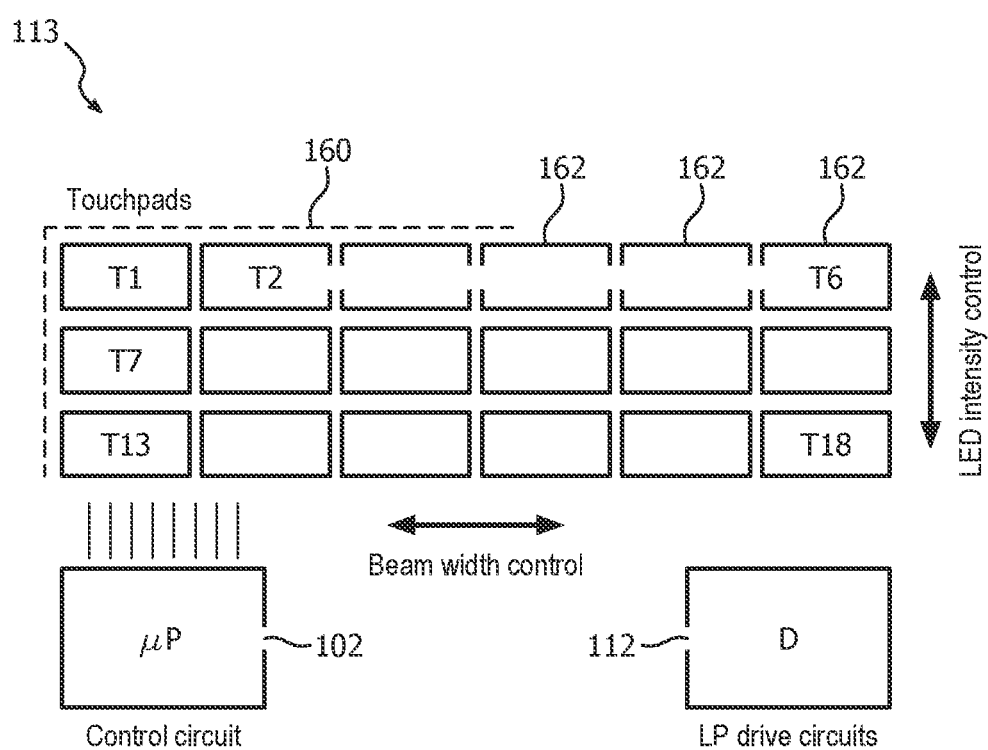
FIG. 5 is a plan view of a touch-sensitive surface in accordance with an embodiment of the invention.

Referring to FIG. 5, a plan view of the touch-sensitive surface 16 in accordance with an embodiment of the invention is disclosed. In particular, the touch-sensitive surface 16 may include a two-dimensional matrix 113 of touch pads (T1-T18) that are coupled to the controller 102 via the touch sensor 162 (FIG. 4). In this diagram, the low power drive electronics are also mounted on the control electronics PCB 160. In one embodiment, the two-dimensional matrix 113 of touch pads (T1-T18) is located over a large portion of the surface and the number of touch pads directly corresponds to the number of light-emitting elements 182 on the LED PCB 180. As described herein, the lighting unit 11 includes vias 101 that connect the microcontroller and low-power drive electronics, with the high power drive electronics. As described above, the touch pads (T1-T18) are connected to controller 102 inputs such that the controller 102 can detect the electrical charge (and hence, locate a touch point); the controller software tracks the touch points to discern movement and input commands.

In another embodiment of the invention, a larger capacitive surface with an underlying grid can be employed instead of using discrete sensor pads. This embodiment may be employed when the touch-sensitive surface 16 is relatively large.

Although not shown in this view, the touch-sensitive surface 16 can include a mode control interface 164 which are user-controlled by an element, such as a button. For example, the mode control interface can be disposed on either side of the two-dimensional matrix 113 of touch pads (T1-T18). These touch pads are used to enter/exit the configuration or editing mode. The mode control interface 164 can provide an electrical mode control signal to the control circuit in response to a mode control touch command from the user.

In an alternative embodiment, a single layer PCB may be employed whereby the light-emitting elements 182 and the touch sensor 162 are placed on the same side of the PCB but spatially spaced apart. In accordance with this embodiment, the PCB may include a ground plane which is connected to the base of the LEDs and is also used for cooling purposes. As before, the ground plane provides shielding such that the power electronics do not interfere with the touch sensing. In this embodiment, the user touches the opposite side of the PCB at the location of the touchpads such that capacitance changes are detected through the plastic and the housing. There are, of course, limits on the thickness of the PCB before the touch sensor becomes desensitized. The maximum thickness depends on a number of factors such as the material being used and the size of the touchpads. In one embodiment, the sensor operates without sensitivity loss when the PCB thickness is on the order of about 3-4 mm. However other designs have been shown to be more sensitive such that the thickness can be as great as a few cm.

Referring to FIG. 6A-6E, diagrams illustrating user actuation of the touch-sensitive surface in accordance with embodiments of the invention are disclosed. In FIG. 6A, the tactual member (TM) (i.e., the user's finger) engages the mode control button 164 to turn the lighting assembly 10 ON or OFF.

In FIG. 6B, the brightness of the LEDs is adjusted by using a portion of the touchpads. For example pads T1, T7 and T13 (FIG. 5) may be used to select up to three light levels. Alternatively, pads T1 to T6 may be used to effect six (6) intensity levels. A single pad may also be used wherein the duration of the touch is used as a measure of the light intensity level. In the present invention, the control interaction is programmable by the user (e.g., the shop owner). When the system is energized initially, there is a time period in which the user can determine which pads are to be used to set the brightness levels. If, for example, the user touches pad T1 to T6 during this time period, then the first row (FIG. 5) will be used as the brightness control. The other pads are then automatically assigned to set the beam width and beam height. The system may be used this way when the user determines that the accuracy/granularity of the brightness levels is more important than the precision of the beam width or height. After programming, the user can place indicators at these touch locations to indicate their function.

In FIG. 6C, a one-location, or a single touch-point command action to change the beam width is performed by touching the touch-sensitive surface 16 with a tactual member (e.g., a user's finger) at a first touch spot location and slidably moving the tactual member from the first touch spot location to a second touch spot location. If an LED is ON, and lies outside the straight line traced-out by the path of the touched pads, whether vertically or horizontally, then it is de-activated. This provides the user with a simple method for adjusting the width and height of the light effect illuminating the object on the shelf below.

In FIG. 6D, the beam width change is effected by way of a two-location touch command action. Briefly stated, the command is performed by touching touch-sensitive surface 16 with a first tactual member TM-1 (e.g., a finger or a stylus) at a first touch spot and simultaneously touching the touch-sensitive surface 16 with a second tactual member TM-2 (e.g., a second finger) at a second touch spot spaced apart from the first touch spot—this action activates all of the LEDs disposed between the two touch spots. If a LED is ON and lies outside the straight line between first touch spot and the second touch spot (vertically or horizontally) then it is de-activated. If it is within the line, it is activated or remains ON. This procedure allows the user to adjust the width and height of the light effect in a relatively simple manner.

To increase the size of the emitted light beam or increase the intensity of the emitted light beam, the distance between the first single touch spot and the second single touch spot is increased by sliding either or both of the first tactual member TM-1 and the second tactual member TM-2 along the touch-sensitive surface 16. A two-location touch command action can also be used to decrease the size of the emitted light beam (or decrease the intensity of the emitted light beam) by decreasing the distance between the first touch spot and the second touch spot by slidably moving either or both of the first tactual member TM-1 and the second tactual member TM-2 along the surface of the touch-sensitive surface 16.

In FIG. 6E, the editing or system configuration mode is entered when the user employs a special gesture. The special gesture is one that has a unique signature that is difficult to perform accidentally. In other words, by using a special gesture, a shop visitor, for example, is prevented from accidentally entering the mode and altering the display lighting effect. On the other hand, the use of a unique or special gesture allows the shop owner to enter the configuration mode when he or she desires to change the system configuration.

In another embodiment, the configuration, editing or interaction mode may be entered by use of an alternate user input device. For example, a dedicated switch or button may be disposed in a concealed location. In another embodiment, the configuration mode may be entered using an RFID/NFC phone or badge. The same input may be used to terminate the configuration mode. Alternatively, the mode could be designed to time-out, such that the system does not recognize configuration mode inputs after a pre-defined amount of time has elapsed. After the time period has elapsed, the system mode toggles back to normal operation mode.

When the system is switched OFF, or to standby, the states of the LEDs are stored in the EEPROM of the controller 102 to ensure that the lighting effect is restored when power is restored.

Figure 7A:
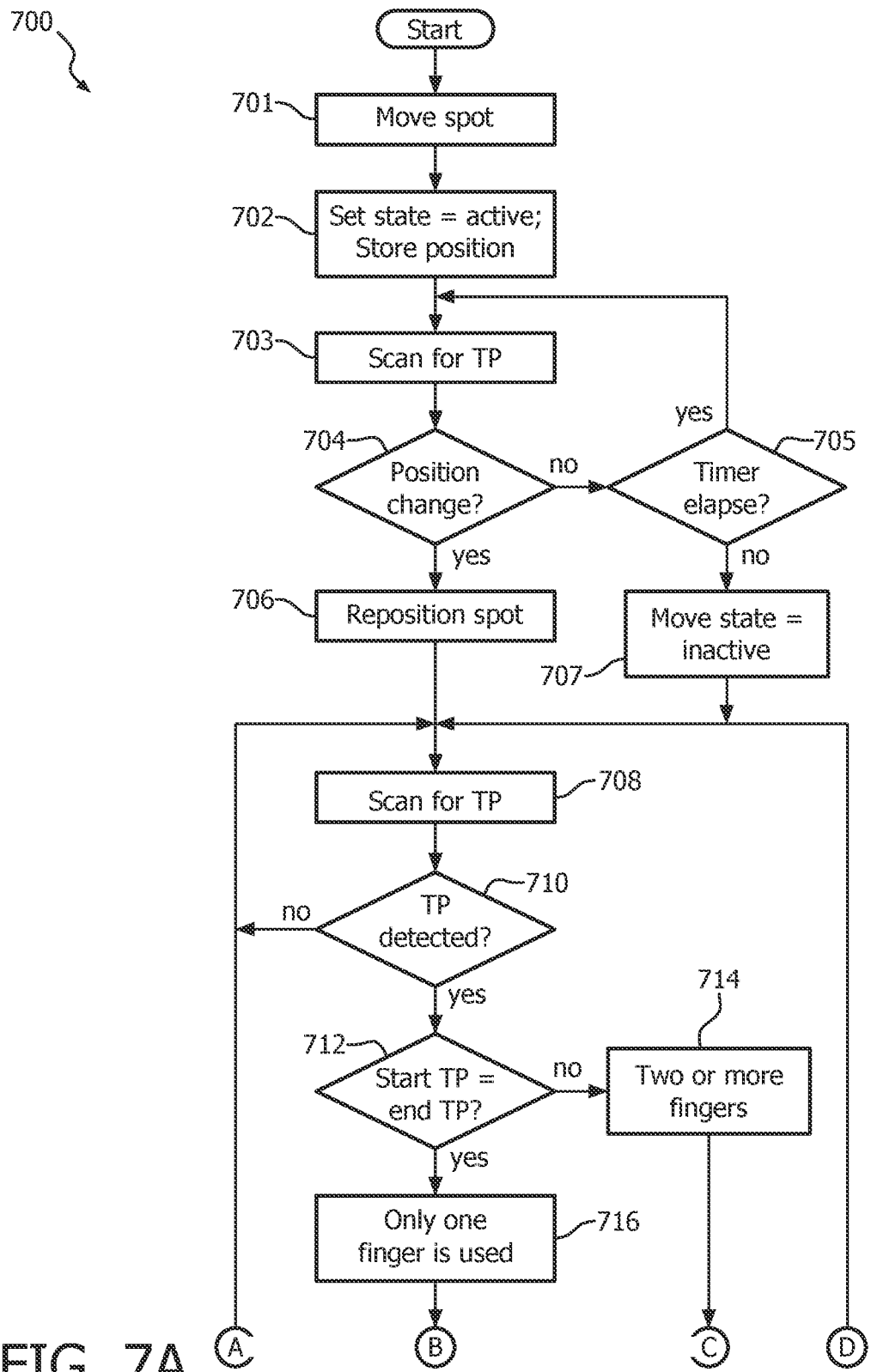
FIG. 7A-7B is a chart illustrating a touch recognition procedure performed by a control circuit in accordance with an embodiment of the invention.
Figure 7B:
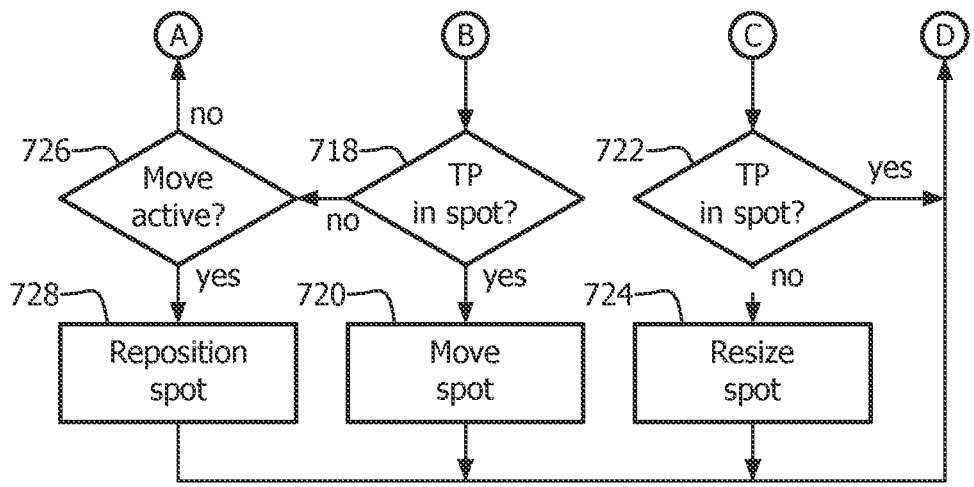

Referring to FIGS. 7A-7B, a chart illustrating a touch recognition procedure performed by a control circuit 100 in accordance with an embodiment of the invention is disclosed. In step 701, the controller 102 recognizes that a touch spot is present due to a change in the charge level at a particular touch pad (e.g., T1-T18) location. The controller enters an active state, stores the position of the touch spot (702), and begins to scan the touch sensor 162 for additional touch spots (703). After each scan, the controller determines if there has been a position change to the touch spot. If so, the controller repositions the touch spot (706). If not, a timer is set. If the timer elapses (705), the controller continues to scan the touch sensor 162. If the touch is detected at the same location, the moving state of the touch spot is deemed to be inactive. Subsequently, the controller resumes scanning the array. In step 710, if a touch spot is detected, the controller determines whether it is a one location touch command (712), i.e., one finger or one stylus is employed, or a two-location command (714), i.e., two fingers are used. If only one finger is used, the controller monitors the movement of the touch spot to determine the size of the requested beam width or intensity (718, 720, 726 and 728). If two fingers are used, the controller monitors the size of the spot, i.e., the region between the two spot locations (722, 724) to determine the size of the requested beam width or intensity.

Figure 8:
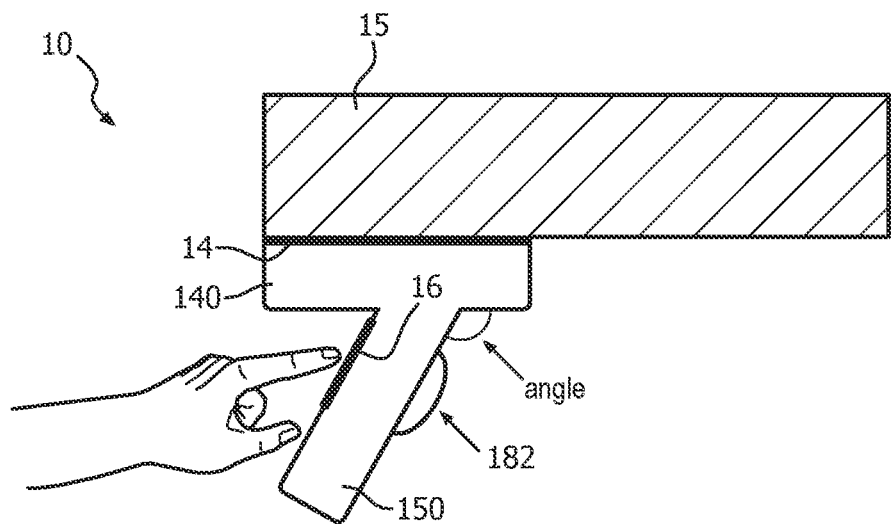
FIG. 8 is a diagram of a lighting assembly in accordance with another embodiment of the present invention.

Referring to FIG. 8, a diagrammatic depiction of the lighting assembly 10 implemented as a touch-sensitive LED strip in accordance with another embodiment of the present invention is disclosed. The lighting assembly has a T-shaped cross-section with a mounting surface 14, a heat sink layer 140, a moveable lower portion 150, and a touch-sensitive surface 16. The light-emitting elements 182 include collimator lenses such that optical element 184 is not required. The LED PCB 180 is adjustably disposed at an angle such that the light can be adjustably directed downwardly toward the predetermined display area 17. The angle can be changed mechanically to adapt the lighting assembly 10 to various shelf widths and/or shelf heights such that the LED PCB 180 is directed toward the display mounting surface. In other words, by changing the angle of the lower member 150, one can change the direction of the emitted light.

Figure 9:
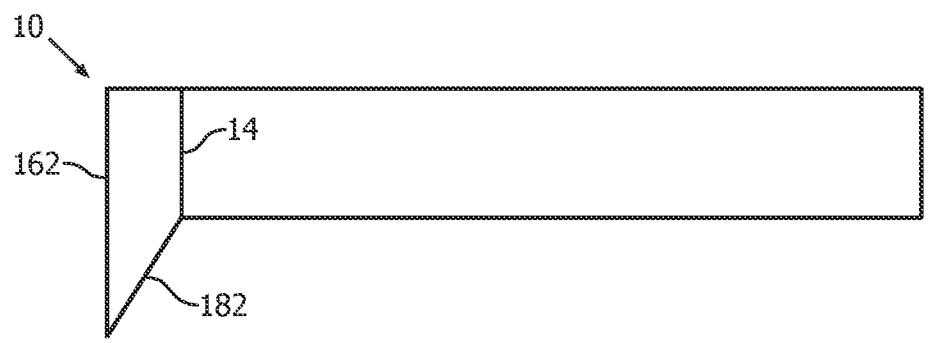
FIG. 9 is a diagram of a lighting assembly in accordance with yet another embodiment of the present invention.

FIG. 9 is a diagram of the lighting assembly 10 implemented as a LED touch-sensitive strip in accordance with yet another embodiment of the present invention. This embodiment may be employed instead of the assembly of FIG. 1 when the user desires to connect the lighting assembly 10 to the front edge of the display shelf instead of to an underside of the shelf. Accordingly, this embodiment provides the user with a different form factor that is conducive to a different mounting arrangement.

Figure 10:
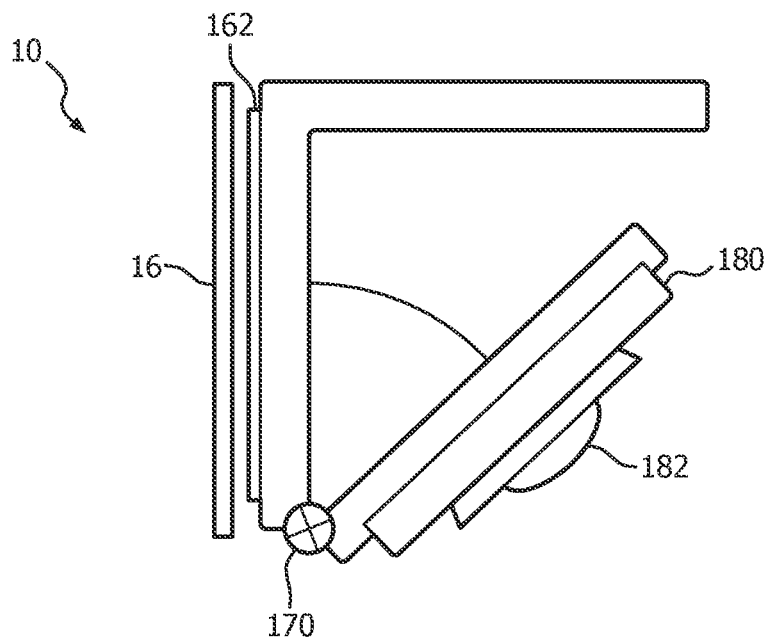
FIG. 10 is a diagram of a lighting assembly in accordance with yet another embodiment of the present invention.

Referring to FIG. 10, a diagram of an LED touch-sensitive strip in accordance with yet another embodiment of the present invention is disclosed. In this embodiment, the LED PCB 180 is rotationally mounted to one end of the lighting unit 11 at pivot point 170. Again, the light-emitting elements 182 include collimator lenses such that optical element 184 is not required. This allows the LED PCB 180 to be manually rotated over a wide range of angles and thus provides the user with a wide range of display options.

Figure 11:
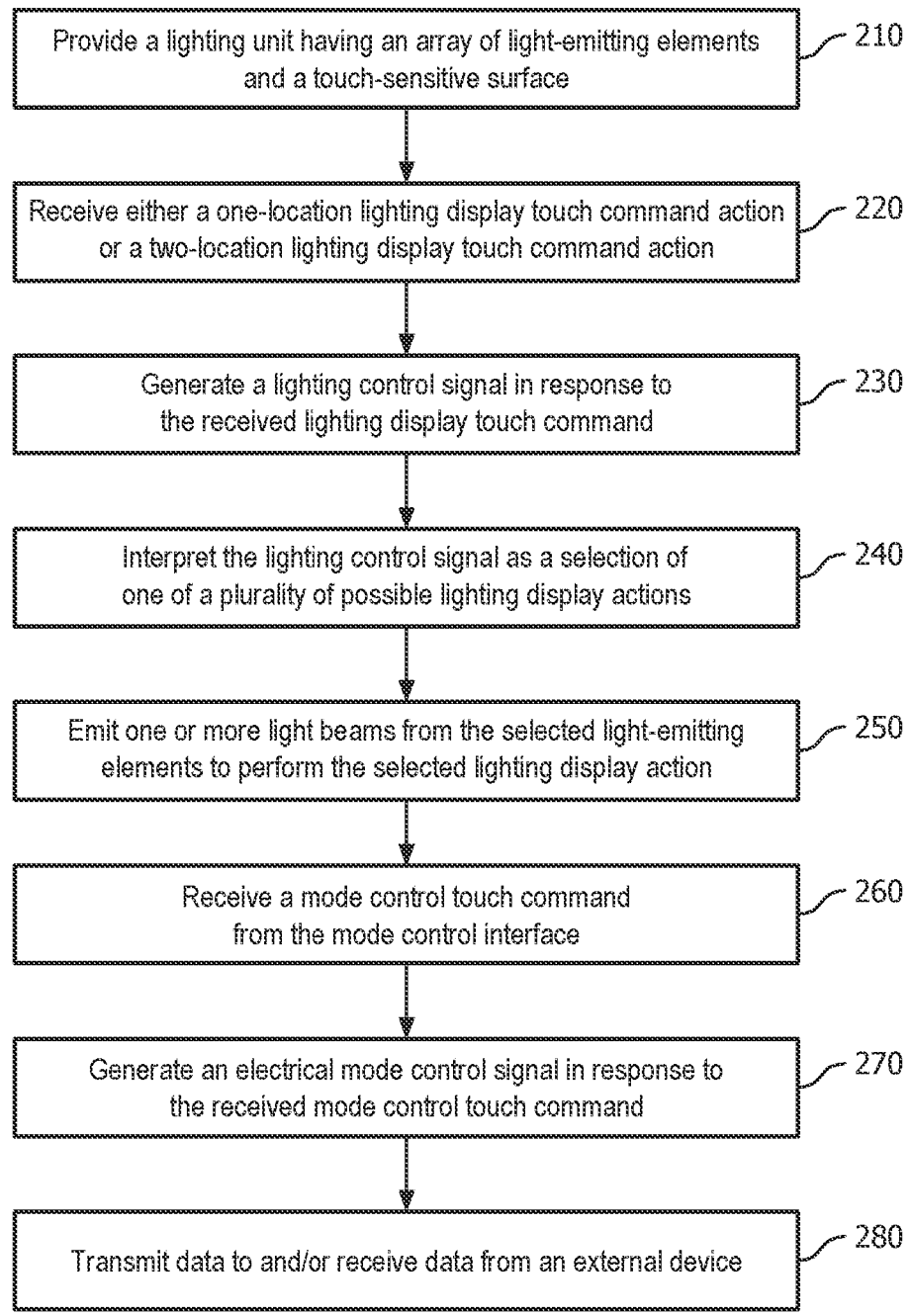
FIG. 11 is a flow chart of a method of controlling a lighting display in accordance with an embodiment of the invention.

Referring to FIG. 11, a flow chart illustrating a method for controlling one or more lighting-emitting elements in an array using touch-sensitive sensors in accordance with an embodiment of the invention is disclosed. In step 210, a lighting assembly is provided. The lighting assembly can comprise any of the embodiments described herein or otherwise envisioned. For example, the lighting assembly can comprise a body member 12 that features three functional surfaces: a mounting surface 14, a touch-sensitive surface 16, and a light-emitting surface 18, with the light-emitting surface comprising an array of lighting elements (182). The touch-sensitive surface can comprise one or more touch sensors (162).

In step 220, the lighting unit receives a lighting display touch command from the touch sensor. According to an embodiment, a user touches the touch-sensitive surface to activate or trigger the touch sensor. The user can, for example, effect the touch command using either of a one-location touch command action or a two-location touch command action, as described above. In step 230, the lighting unit generates a lighting control signal in response to receipt of the lighting display touch command from the touch sensor. Once generated, the lighting control signal can be sent to the control circuit 100. In step 240, the control circuit interprets the lighting control signal as one of a number of possible lighting display actions or options. For example, the actions can include emitting the light beam from selected light-emitting elements within the array of light emitting elements to establish a location of the light beam and a size of the light beam in at least one spatial dimension, and/or controlling an intensity of the light emitted from the selected light-emitting elements, among many other options. In step 250, the control circuit directs the selected light-emitting elements to perform the selected action. For example, one or more of the light-emitting elements can be turned on or off, or the size or intensity of the light emitted by the light-emitting elements can be adjusted, among many other options.

According to another embodiment, the lighting assembly 10 further comprises a mode control interface 164. A user touches the mode control interface in step 260, and the lighting unit generates an electrical mode control signal in step 270 to direct the array of light-emitting elements to operate in a predetermined operational mode. The predetermined operational mode can include an ON mode, an OFF mode, an assembly commissioning mode, a programming mode, and an editing mode, among many others. The mode control interface can be controlled using either a one-location touch command action or a two-location touch command action, as described in greater detail above.

According to another embodiment of the method, the lighting assembly 10 further comprises a communication interface 110 coupled to a control circuit 100. The communication interface can be configured to transmit data to and/or receive data from an external device in step 280. For example, the data can include lighting display action data or operational mode data, among many other types of data.

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

It should also be understood that, unless clearly indicated to the contrary, in any methods claimed herein that include more than one step or act, the order of the steps or acts of the method is not necessarily limited to the order in which the steps or acts of the method are recited.

Also, reference numerals appearing in the claims between parentheses, if any, are provided merely for convenience and should not be construed as limiting the claims in any way.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A lighting assembly, comprising:
a body member configured to be coupled to an external structure;
an optical element coupled to the body member, the optical element being configured to direct a light beam toward a predetermined display area;
a lighting unit disposed in the body member, the lighting unit including an array of light-emitting elements, one or more of the array of light-emitting elements being configured to emit the light beam toward the optical element;
a touch-sensitive surface coupled to the body member, the touch-sensitive surface including a touch sensor configured to provide at least one lighting control signal in response to a lighting display touch command by a user, the lighting display touch command being effected by either a one-location touch command action or a two-location touch command action; and
a control circuit disposed in the body member, the control circuit being coupled to the lighting unit and the touch-sensitive surface, the control circuit being configured to interpret the at least one lighting control signal generated by the lighting display command action as one of a plurality of lighting display actions, the plurality of lighting display actions including emitting the light beam from selected light-emitting elements of the array of light-emitting elements to establish a location of the light beam and a size of the light beam in at least one spatial dimension, and controlling an intensity of the light beam emitted from the selected light-emitting elements,
wherein the body member has a substantially triangular cross-section including the optical element on a first side, the touch-sensitive surface on a second side, and a mounting surface on a third side and the optical element, the touch-sensitive surface, and the mounting surface form a light emitting chamber surrounding the array of light-emitting elements, wherein the light emitting chamber has a substantially triangular cross-section.

2. The lighting assembly of claim 1, wherein the touch-sensitive surface includes at least one mode control interface configured to a provide electrical mode control signal in response to a mode control touch command, the control circuit being configured to drive the lighting display assembly in a predetermined operational mode in accordance with the electrical mode control signals.

3. The lighting assembly of claim 2, wherein the predetermined operational mode is selected from a group of operational modes including an ON mode, an OFF mode, an assembly commissioning mode, a programming mode, or an editing mode.

4. The lighting assembly of claim 1, wherein the one-location touch command action is performed by touching the touch-sensitive surface with a tactual member at a first touch spot location and slidably moving the tactual member from the first touch spot location to a second touch spot location.

5. The lighting assembly of claim 1, wherein the two-location touch command action includes touching the touch-sensitive surface with a first tactual member at a first touch spot and substantially simultaneously touching the touch-sensitive surface with a second tactual member at a second touch spot spaced apart from the first touch spot.

6. The lighting assembly of claim 1, wherein the touch-sensitive surface includes a two-dimensional matrix of touch sensors.

7. The lighting assembly of claim 6, wherein each touch sensor in the two-dimensional matrix corresponds to a light-emitting element in the array of light-emitting elements.

8. The lighting assembly of claim 6, wherein each touch sensor is a capacitive touch sensor.

9. The lighting assembly of claim 6, wherein each touch sensor is an optical touch sensor.

10. The lighting assembly of claim 1, wherein the body member comprises a heat sink layer configured to direct thermal energy generated by the assembly into the external structural.

11. The lighting assembly of claim 1, further comprising a communication interface coupled to the control circuit, the communication interface being configured to transmit data to an external device or receive data from the external device.

12. The lighting assembly of claim 11, wherein the external device is at least one second lighting assembly.

13. The lighting assembly of claim 1, wherein the mounting surface comprises an adhesive element configured to mount the body member to the external structure.

14. The lighting assembly of claim 13, wherein the adhesive element is configured to conduct thermal energy from the body member to the external structure.

15. A method, comprising:
providing a lighting unit disposed in a body member of a lighting assembly, the light unit including an array of light-emitting elements and a touch-sensitive surface, the touch-sensitive surface including a touch sensor;
receiving a lighting display touch command from the touch sensor, the lighting display touch command being effected by either a one-location touch command action or a two-location touch command action;
generating at least one lighting control signal in response to the lighting display touch command;
interpreting the at least one lighting control signal provided by the lighting display touch command as one of a plurality of lighting display actions, the plurality of lighting display actions including emitting the light beam from selected light-emitting elements of the array of light emitting elements to establish a location of the light beam and a size of the light beam in at least one spatial dimension, and controlling an intensity of the light emitted from the selected light-emitting elements; and
emitting the light beam from the selected light-emitting elements to perform the lighting display action in response to the lighting display touch command,
wherein the body member has a substantially triangular cross-section including an optical element on a first side, the touch-sensitive surface on a second side, and a mounting surface on a third side and the optical element, the touch-sensitive surface, and the mounting surface form a light emitting chamber surrounding the array of light-emitting elements, wherein the light emitting chamber has a substantially triangular cross-section.

16. The method of claim 15, wherein the one-location touch command action is performed by touching the lighting display control interface at a first touch spot location with a tactual member and slidably moving the tactual member from the first touch spot location to a second touch spot location.

17. The method of claim 15, wherein each the two-location touch command action includes touching the touch-sensitive surface with a first tactual member at a first touch spot and substantially simultaneously touching the lighting display control interface with a second tactual member at a second touch spot spaced apart from the first touch spot.

18. The method of claim 17, wherein the two-location touch command action to decrease the size of the emitted light beam or decrease the intensity of the emitted light beam is performed by decreasing a distance between the first touch spot and the second touch spot by slidably moving either or both of the first tactual member and the second tactual member along the touch-sensitive surface.

19. The method of claim 17, wherein the two-location touch command action to increase the size of the emitted light beam or increase the intensity of the emitted light beam is performed by increasing a distance between the first single touch spot and the second single touch spot by sliding either or both of the first tactual member and the second tactual member along the touch-sensitive surface.

20. The method of claim 15, further comprising transmitting data to an external device or receiving data from the external device, the data including lighting display action data or operational mode data.

* * * * *